(12) United States Patent
Chen

(10) Patent No.: US 7,781,150 B2
(45) Date of Patent: Aug. 24, 2010

(54) METHOD OF PHOTOLITHOGRAPHIC EXPOSURE

(75) Inventor: Frederick T Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 668 days.

(21) Appl. No.: 11/613,121

(22) Filed: Dec. 19, 2006

(65) Prior Publication Data

US 2008/0145796 A1    Jun. 19, 2008

(51) Int. Cl.
*G03F 7/20* (2006.01)
(52) U.S. Cl. .................. 430/311; 430/322
(58) Field of Classification Search .......... 430/311, 430/322
See application file for complete search history.

(56) References Cited

U.S. PATENT DOCUMENTS

| | | | |
|---|---|---|---|
| 5,407,785 | A | 4/1995 | Leroux |
| 5,739,898 | A | 4/1998 | Ozawa et al. |
| 6,245,492 | B1 | 6/2001 | Huang et al. |
| 7,022,452 | B2 | 4/2006 | Lu |

FOREIGN PATENT DOCUMENTS

| | | |
|---|---|---|
| JP | 62-135821 | 6/1987 |
| JP | 05-082407 | 4/1993 |
| JP | 05-158244 | 6/1993 |
| JP | 10-326746 | 12/1998 |

*Primary Examiner*—Kathleen Duda
(74) *Attorney, Agent, or Firm*—Quintero Law Office

(57) ABSTRACT

A method of photolithographic exposure is disclosed. The photolithographic exposure method comprises providing a substrate, forming a first resist layer thereon, forming a second resist layer on the first resist layer, the second resist layer providing a transmission which first increases then decreases as exposure dose increases, and exposing the second resist layer.

15 Claims, 5 Drawing Sheets

METHOD OF PHOTOLITHOGRAPHIC EXPOSURE

BACKGROUND OF THE INVENTION

1. Field of the Invention

The invention relates to photolithographic exposure, and in particular to a method of nonlinear photolithographic exposure.

2. Description of the Related Art

The half-pitch resolution limit of a photolithographic system is given by $0.25\lambda/NA$, where $\lambda$ is the exposure wavelength, and NA is the numerical aperture (sine of the maximum angle in the final lens). Traditionally, resolution has been improved by reducing the wavelength. For example, the industry has shifted from predominant use of KrF (248 nm) to ArF (193 nm) lasers as light sources. A shift to extreme-ultraviolet sources using 13.5 nm wavelength is popularly being contemplated. In addition, electron beams offer even shorter wavelength (~4 μm). However, the use of short wavelength radiation generates secondary electrons if the energy of a single radiation quantum exceeds the ionization potential of the exposed material. The secondary electrons constitute an additional exposing agent, and degrade the resolution of the lithography process. Resolution below 40 nm becomes less repeatable due to the stochastic behavior of the secondary electrons. Even more significantly, the secondary electrons contribute significantly to line-edge roughness, especially in chemically amplified resists.

Low-energy massive particles such as electrons or atoms can constitute short-wavelength, non-ionizing radiation. The de-Broglie relation gives the particle wavelength as $\lambda=h/(mv)$, where h is Planck's constant, m is the particle mass, and v is the particle velocity. However, given their low kinetic energy, it is difficult to build optical systems that direct their motion. In addition, upon impacting the sample, their motion becomes completely uncontrollable. In the case of electrons, charging and, scattering can cause spreading and subsequent loss of resolution. In the case of atoms, van der Waals forces, thermal motion, surface diffusion or etching can cause loss of feature resolution and smoothness as well as feature damage.

Current state-of-the-art optical lithography systems utilize an ArF excimer laser source, and an imaging medium of water. The water immersion medium reduces the wavelength from 193 nm to 134 nm. Consequently, the minimum half-pitch resolution achievable using conventional resolution enhancement is about 36 nm. In order to use the same optical system to exceed the optically defined half-pitch limit, a second exposure of a second coated photoresist layer is normally required on the same tool. This will result in reduced throughput, higher consumption of costly materials, and reduced yield due to overlay errors.

Most state-of-the-art photoresists are characterized by the absence of photo-bleaching. In other words, the absorption is independent of intensity. As a result, the photoresist half-pitch image resolution matches the optical prediction.

It is possible for photoresist resolution to exceed the optical resolution by as much as a factor of two, if special absorption mechanisms are used. One such mechanism is two-photon absorption, which is the simultaneous absorption of two photons as effectively one photon with effectively half the wavelength. The absorption is a second-order function of the intensity. This enables significant contrast enhancement. Furthermore with an appropriate exposure strategy, such as nonlinear multiple exposure (NOLMEX), the resolution can be enhanced as well. Two-photon absorption suffers from three drawbacks, however. First, the two-photon absorption is only allowed when single-photon absorption is not. This constrains the required chemistry. Second, the absorption is proportional to the square of the intensity, so the drop in intensity with loss of focus means the focus window of the image formed in the photoresist is reduced. Third, two-photon absorption leads to ionization which provides no advantage over merely reducing the wavelength.

It is not necessary to rely on two-photon absorption to achieve nonlinear absorption. For example, photobleaching is a well-modeled effect.

In U.S. Pat. No. 5,739,898 "Exposure method and apparatus", a photosensitive material is utilized in which "effective light intensity" is nonlinear with respect to intensity. In other words, the latent image is proportional to a nonlinear function of intensity. By use of multiple exposures mutually shifted with respect to one another, a higher resolution pattern is formed. The dependence on multiple exposures obviously leads to reduced throughput, higher cost, and greater sensitivity to alignment error. The invention requires only a single exposure. Double or multiple exposures on the same tool are also used in JP05082407A2 "Method for forming fine pattern," U.S. Pat. No. 6,245,492 "Photoresist system and process for aerial image enhancement," and U.S. Pat. No. 5,407,785 "Method for generating dense lines on a semiconductor wafer using phase-shifting and multiple exposures."

Likewise in JP10326746A2 "Method of Forming Mask Pattern," a photo-bleaching film is used on top of photoresist, to improve resist shape and control. However no anti-bleaching is used, so no pitch resolution enhancement can be realized.

In U.S. Pat. No. 7,022,452 "Contrast enhanced photolithography", a photobleaching layer is used as a contrast enhancing layer disposed on top of an imaging photoresist layer. While contrast improvement is demonstrated, there is no resolution enhancement in merely adding a contrast enhancing material on top of photoresist. The invention offers a two-fold resolution enhancement.

In JP62135821A2 "Formation of Pattern" a thin bleaching film is used to expose photosensitive resin, but the result is to improve the uniformity of contrast enhancement, not resolution.

In JP05158244A2 "Pattern Forming Method" an anti-bleaching negative photoresist is itself developed as the imaging layer. However, no bleaching occurs, so the method cannot offer higher resolution, since the top portion of the resist darkens first, allowing light to spread as it propagates to the bottom of the resist.

BRIEF SUMMARY OF THE INVENTION

The invention provides a method of photolithographic exposure, comprising the following steps. A substrate is provided. A first resist layer is formed thereon. A second resist layer is formed on the first resist layer. The second resist layer possesses a transmission which first increases then decreases as exposure dose increases. The second resist layer is exposed.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
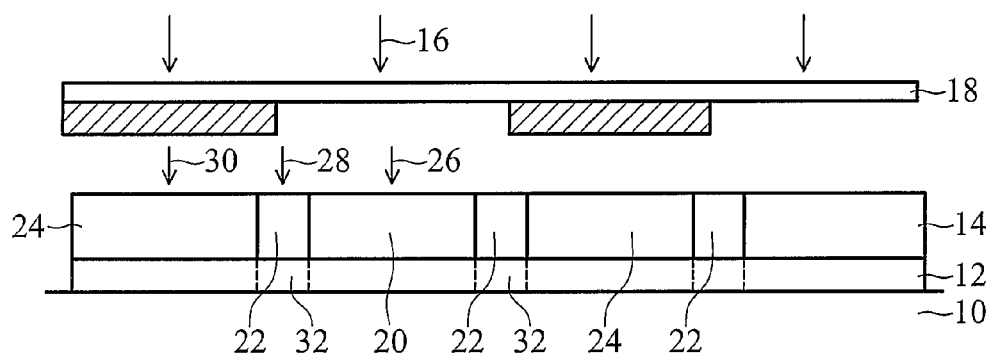
FIGS. 1A~1B show a method of photolithographic exposure of the invention.
Figure 1B:
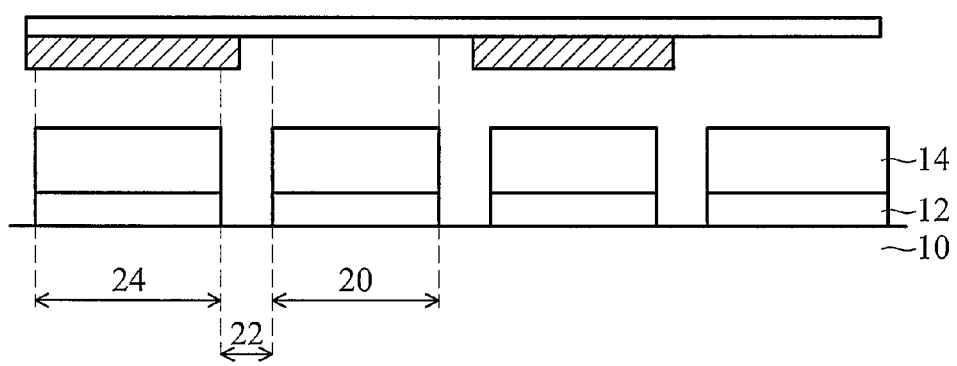

A method of photolithographic exposure provided by the invention is shown in FIGS. 1A~1B. Referring to FIG. 1A, a substrate 10 is provided. Next, a first resist layer 12 is formed thereon. A second resist layer 14 providing transmission which first increases then decreases as an increasing exposure dose is then formed on the first resist layer 12. Next, the second resist layer 14 is exposed 16 through a mask 18. The second resist layer 14 and the first resist layer 12 are then developed, as shown in FIG. 1B. A bake may precede the develop step as needed.

The first resist layer 12 may be a material that undergoes bond scission or crosslinking upon irradiation (such as PMMA or ZEP) or the same material as the second resist layer 14. The second resist layer may comprise a photosensitive compound such as diazonaphtoquinone (DNQ) and a resin such as novolac resin. Alternatively the second layer may be a chemically amplified resist layer. The photosensitive compound has a weight percent of about 0.5-70%. The second resist layer 14 has a thickness of about 100-1000 nm.

Figure 2:
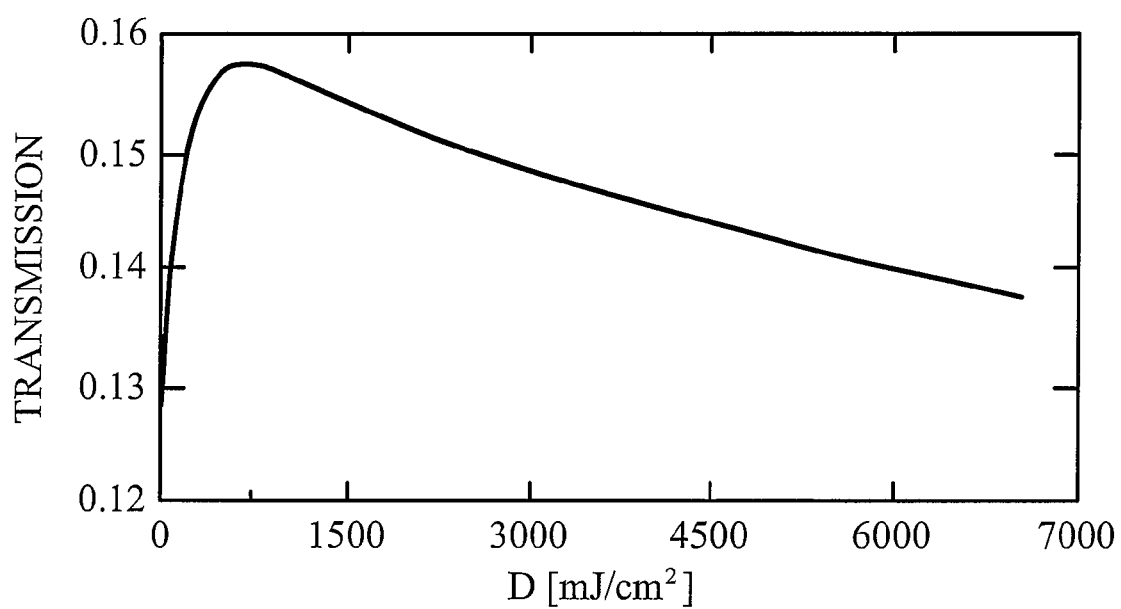
FIG. 2 shows a typical transmission versus exposure dose curve for a nonlinear novolac-based photoresist.

Referring to FIG. 2, a typical transmission versus exposure dose curve for a nonlinear novolac-based photoresist (such as the second resist layer 14) is shown. The absorption is dependent on the concentration of photosensitive DNQ in the photoresist and follows the well-known Lambert-Beer law. As the DNQ is broken down with increasing exposure to UV light, the absorption subsequently decreases. In other words, the transmission increases in the region with greater exposure.

In addition to absorption by the photosensitive compound, there is also absorption by the resin. This becomes more predominant at higher doses. Two possible mechanisms are the formation of chromophores (light-absorbing groups) and crosslinking. The net result is absorption increases as a function of dose. In other words, the transmission decreases in the region with greater exposure. The preferred nonlinear photoresist may consist of a photosensitive bleaching absorber and a weakly photosensitive darkening agent, in addition to other components which are largely transparent.

FIG. 1A shows a detailed exposure process in which the second resist layer 14 comprises a first exposed region 20, a second exposed region 22, and a third exposed region 24. While exposing 16, the first exposed region 20 is illuminated with a first exposure intensity 26. The second exposed region 22 is illuminated with a second exposure intensity 28. The third exposed region 24 is illuminated with a third exposure intensity 30. The first exposure intensity 26 is maximal, the third exposure intensity 30 is minimal, and the second exposure intensity 28 is intermediate thereamong. For a certain duration, according to the property of the second resist layer 14, the transmission of the second exposed region 22 exceeds the first exposed region 20 and the third exposed region 24 such that the first resist layer 32 corresponding to the second exposed region 22 receives a larger accumulated exposure dose than other regions thereof.

Figure 3:
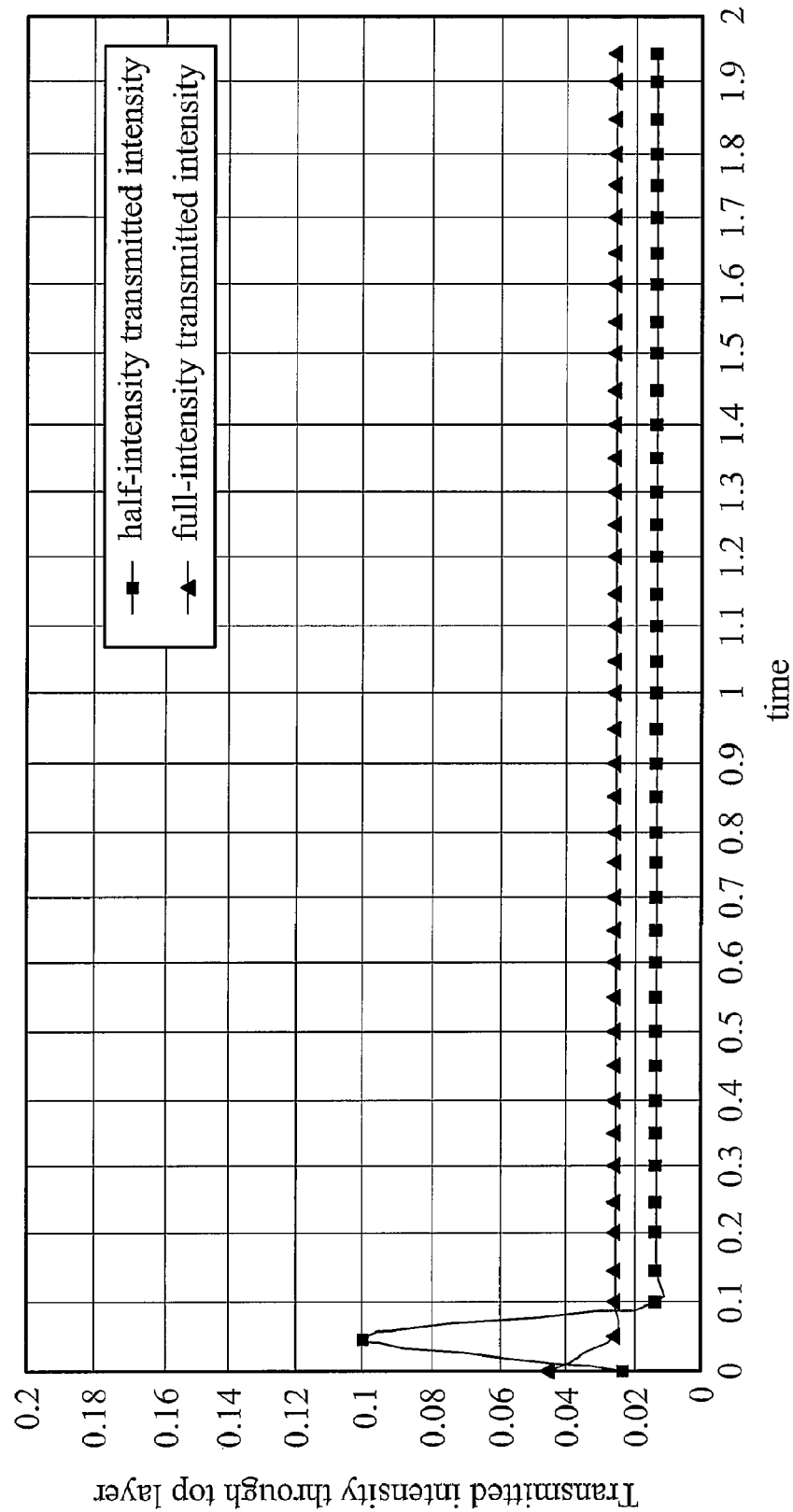
FIG. 3 shows the transmitted intensity of half-intensity and full-intensity of the invention.
Figure 4:
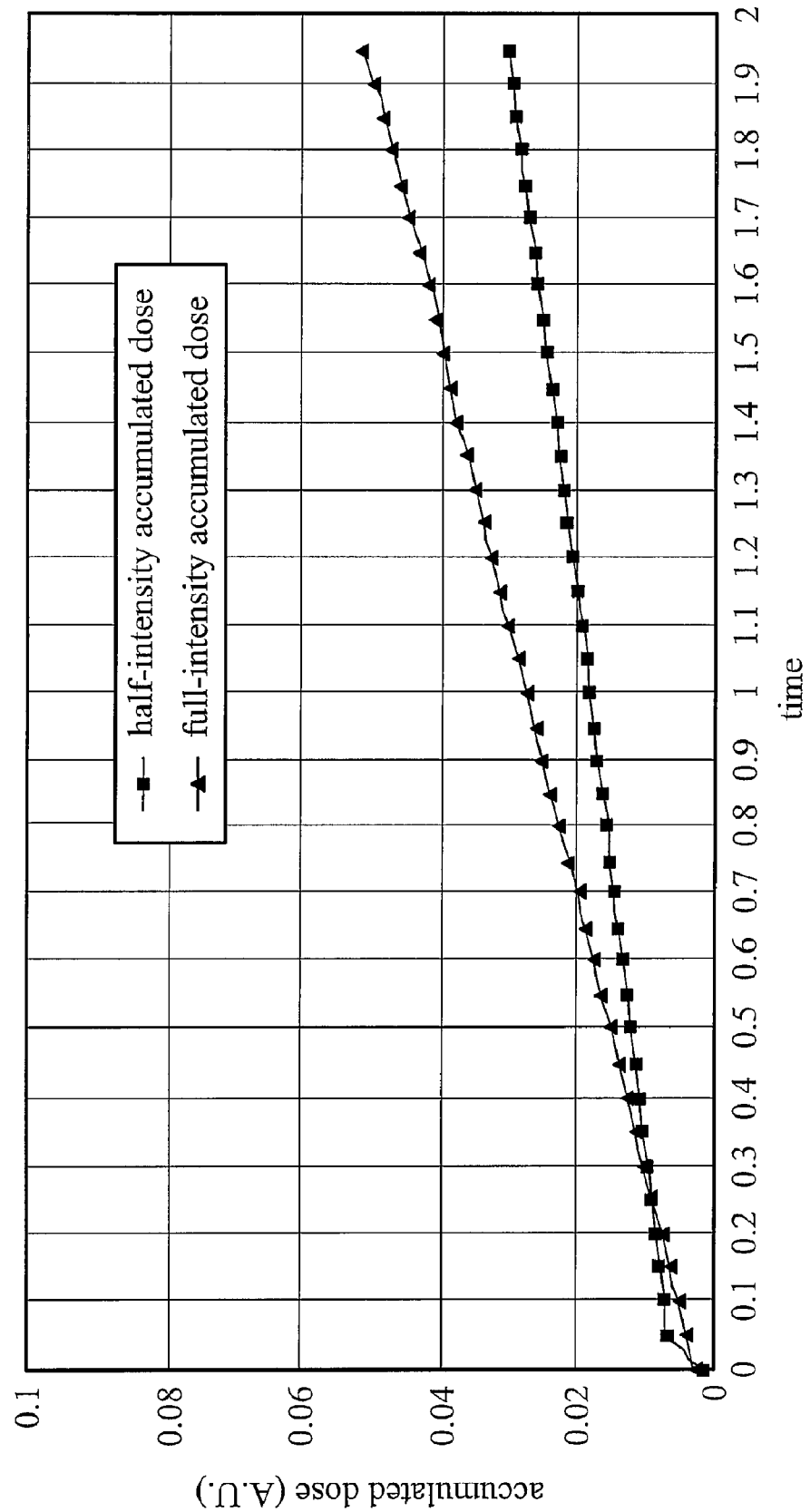
FIG. 4 shows the accumulated dose of half-intensity and full-intensity of the invention.

Referring to FIGS. 3 and 4, the transmitted intensity and accumulated dose of the half-intensity region and the full-intensity region are shown, respectively. The transmission image is preferably captured at the threshold level (half-intensity accumulated dose higher than full-intensity accumulated dose) by a thin imaging photoresist (the first resist layer 12) underneath the nonlinear transmission photoresist layer (the second resist layer 14). The use of a thin bottom imaging photoresist layer is expected to be required for adequate resolution.

Referring to FIG. 1B, the second resist layer 14 is cross-linked in the first exposed region 20 so that the second resist layer 14 has a lower development rate in the first exposed region 20 and the third exposed region 24 than in the second exposed region 22.

To improve etch resistance during pattern transfer, it is preferable to retain a portion of the top layer after development, while allowing the bottom layer to be processed normally. This is made possible by cross-linking of the top layer in the region of the highest exposure intensity.

It is possible to develop the top layer so that the lowest and highest exposure intensity regions result in a retained top layer while the intermediate exposure intensity region, corresponding to the highest accumulated dose, are fully developed away, leaving the bottom open to further processing. Alternatively, the bottom portion of the second resist layer 14 can serve as the first resist layer 12.

Figure 5B:
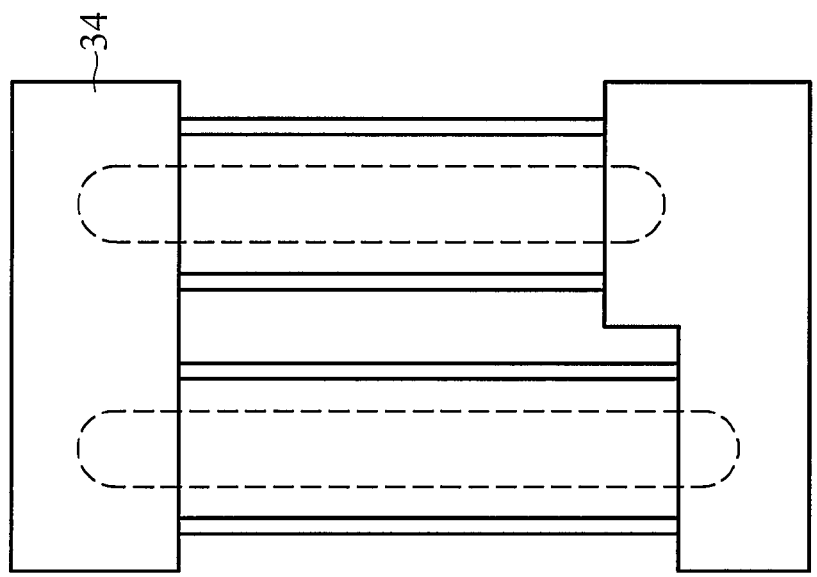
FIGS. 5A~5B show use of pre-pattern shallow mesas or trenches to remove feature loop ends of the invention.
Figure 5A:
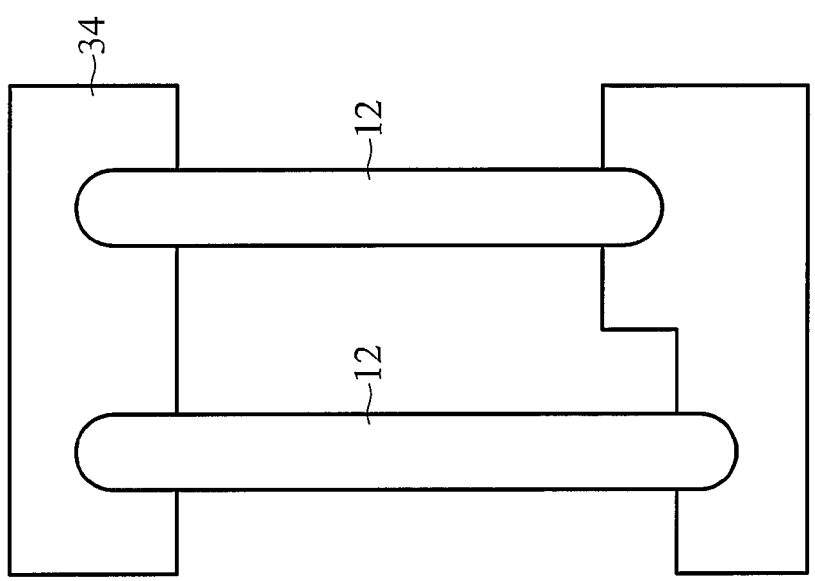

Additionally, the first resist layer 12 overlies a pre-patterned surface. Referring to FIG. 5A, it must be recognized that features to be printed are generally drawn rectangles or consist of joined drawn rectangles 12. The end of a drawn rectangle will result in the printing of a loop end. As a result it may be necessary to pre-pattern shallow mesas or trenches 34 (depth and alignment not critical) at the locations of the line ends. The change in topography results in a reflection and transmission difference, and hence a substantial accumulated dose change at the line ends causing the loop ends not to print, as shown in FIG. 5B.

The advantage of the invention is enhanced feature pitch resolution or feature density 2× beyond the conventional limits of the optical system ($0.25\lambda/NA$), without resorting to an additional exposure step. This also allows continued use of existing photolithography equipment for an extra two process-nodes.

A cost advantage is present even for use of older technology generations (e.g., 90 nm or 130 nm nodes). The reason is the mask image can be made relatively coarse, for example, for directly printing 0.25 um lines and spaces, but the technique can achieve a much finer image, i.e., 0.125 um lines and spaces. Thus, the mask can be simplified and the mask cost can be reduced significantly, as other expensive resolution enhancements such as phase-shifting may be no longer needed.

The invention provides other fundamental benefits over the use of non-optical lithography methods. Since the dose is typically high (~100 mJ/cm$^2$), the shot noise effect is negligible. No secondary electrons are generated, since non-ionizing radiation is used. Hence, the exposure is less prone to generate line edge roughness.

While the invention has been described by way of example and in terms of preferred embodiment, it is to be understood that the invention is not limited thereto. To the contrary, it is intended to cover various modifications and similar arrangements (as would be apparent to those skilled in the art).

Therefore, the scope of the appended claims should be accorded the broadest interpretation so as to encompass all such modifications and similar arrangements.

What is claimed is:

1. A method of photolithographic exposure, comprising:
   providing a substrate;
   forming a first resist layer thereon;
   forming a second resist layer on the first resist layer, the second resist layer providing transmission which first increases then decreases as exposure dose increases; and
   exposing the second resist layer.

2. The method of photolithographic exposure as claimed in claim 1, wherein the first resist layer is the same material as the second resist layer.

3. The method of photolithographic exposure as claimed in claim 1, wherein the second resist layer is a chemically amplified resist layer.

4. The method of photolithographic exposure as claimed in claim 1, wherein the second resist layer comprises a photosensitive compound and a resin.

5. The method of photolithographic exposure as claimed in claim 4, wherein the photosensitive compound comprises diazonaphtoquinone (DNQ).

6. The method of photolithographic exposure as claimed in claim 4, wherein the resin is a novolac resin.

7. The method of photolithographic exposure as claimed in claim 4, wherein the photosensitive compound has a weight percent of about 0.5-70%.

8. The method of photolithographic exposure as claimed in claim 1, wherein the second resist layer has a thickness of about 100-1000 nm.

9. The method of photolithographic exposure as claimed in claim 1, wherein the second resist layer comprises a first exposed region having a first exposure intensity, a second exposed region having a second exposure intensity, and a third exposed region having a third exposure-intensity.

10. The method of photolithographic exposure as claimed in claim 9, wherein the first exposure intensity is maximal, the third exposure intensity is minimal, and the second exposure intensity is intermediate thereamong.

11. The method of photolithographic exposure as claimed in claim 10, wherein the transmission of the second exposed region exceeds the first and third exposed regions, for a certain duration of the exposure.

12. The method of photolithographic exposure as claimed in claim 10, wherein the first resist layer corresponding to the second exposed region receives a larger accumulated exposure dose than other regions thereof.

13. The method of photolithographic exposure as claimed in claim 10, wherein the second resist layer is cross-linked in the first exposed region.

14. The method of photolithographic exposure as claimed in claim 12, wherein the second resist layer has a lower development rate in the first and third exposed regions than in the second exposed region.

15. The method of photolithographic exposure as claimed in claim 1, wherein the first resist layer overlies a pre-patterned surface.

* * * * *